(12) United States Patent
O'Donnell et al.

(10) Patent No.: US 8,105,441 B2
(45) Date of Patent: Jan. 31, 2012

(54) CARRIER FOR REDUCING ENTRANCE AND/OR EXIT MARKS LEFT BY A SUBSTRATE-PROCESSING MENISCUS

(75) Inventors: Robert O'Donnell, Fremont, CA (US); Eric Lenz, Pleasanton, CA (US); Mark Wilcoxson, Oakland, CA (US); Mike Ravkin, Sunnyvale, CA (US); Alexander A. Yatskar, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/094,153

(22) Filed: Apr. 26, 2011

(65) Prior Publication Data

US 2011/0197928 A1    Aug. 18, 2011

Related U.S. Application Data

(62) Division of application No. 11/537,501, filed on Sep. 29, 2006, now Pat. No. 7,946,303.

(51) Int. Cl.
*B08B 1/02* (2006.01)
*B08B 5/04* (2006.01)
*B08B 11/02* (2006.01)
*B08B 3/04* (2006.01)
*B08B 3/10* (2006.01)

(52) U.S. Cl. .............................. 134/32; 134/21; 134/34
(58) Field of Classification Search ................... 134/21, 134/32, 34
See application file for complete search history.

(56) References Cited

OTHER PUBLICATIONS

None*

* cited by examiner

*Primary Examiner* — Michael Kornakov
*Assistant Examiner* — Natasha Campbell
(74) *Attorney, Agent, or Firm* — Martine Penilla Group, Inc.

(57) ABSTRACT

A carrier for supporting a substrate during processing by a meniscus formed by upper and lower proximity heads is described. The carrier includes a frame having an opening sized for receiving a substrate and a plurality of support pins for supporting the substrate within the opening. The opening is slightly larger than the substrate such that a gap exists between the substrate and the opening. Means for reducing a size and frequency of entrance and/or exit marks on substrates is provided, the means aiding and encouraging liquid from the meniscus to evacuate the gap. A method for reducing the size and frequency of entrance and exit marks is also provided.

20 Claims, 10 Drawing Sheets

CARRIER FOR REDUCING ENTRANCE AND/OR EXIT MARKS LEFT BY A SUBSTRATE-PROCESSING MENISCUS

CLAIM OF PRIORITY

This application is a divisional application of U.S. patent application Ser. No. 11/537,501, filed on Sep. 29, 2006, now U.S. Pat. No. 7,946,303, which is incorporated herein by reference in its entirety.

CROSS-REFERENCE TO RELATED APPLICATIONS

The present Application is related to the following U.S. Patents and U.S. Patent Applications, all of which are incorporated herein by reference in their entirety: U.S. Pat. No. 6,488,040, issued on Dec. 3, 2002 to De Larios, et al. and entitled, "Method And Apparatus For Drying Semiconductor Wafer Surfaces Using A Plurality Of Inlets And Outlets Held In Close Proximity To The Wafer Surfaces;" U.S. patent application Ser. No. 10/330,843, filed on Dec. 24, 2002 and entitled, "Meniscus, Vacuum, IPA Vapor Drying Manifold;" U.S. patent application Ser. No. 10/330,897, also filed on Dec. 24, 2002, entitled, "System For Substrate Processing With Meniscus, Vacuum, IPA Vapor, Drying Manifold;" U.S. patent application Ser. No. 10/404,692, filed Mar. 31, 2003 and entitled, "Methods And Systems For Processing A Substrate Using A Dynamic Liquid Meniscus;" and U.S. patent application Ser. No. 10/817,620, which was filed on Apr. 1, 2004, entitled, "Substrate Meniscus Interface And Methods For Operation."

BACKGROUND

In the semiconductor chip fabrication industry, it is necessary to clean and dry a substrate after a fabrication operation has been performed that leaves unwanted residues on the surfaces of the substrate. Examples of such a fabrication operations include plasma etching (e.g., tungsten etch back (WEB)) and chemical mechanical polishing (CMP). In CMP, a substrate is placed in a holder that pushes a substrate surface against a polishing surface. The polishing surface uses a slurry which consists of chemicals and abrasive materials. Unfortunately, the CMP process tends to leave an accumulation of slurry particles and residues on the substrate surface. If left on the substrate, the unwanted residual material and particles may cause defects. In some cases, such defects may cause devices on the substrate to become inoperable. Cleaning the substrate after a fabrication operation removes unwanted residues and particulates.

After a substrate has been wet cleaned, the substrate must be dried effectively to prevent water or cleaning fluid, (hereinafter, "fluid") remnants from leaving residues on the substrate. If the cleaning fluid on the substrate surface is allowed to evaporate, as usually happens when droplets form, residues or contaminants previously dissolved in the fluid will remain on the substrate surface after evaporation and can form spots. To prevent evaporation from taking place, the cleaning fluid must be removed as quickly as possible without the formation of droplets on the substrate surface. In an attempt to accomplish this, one of several different drying techniques are employed such as spin-drying, IPA, or Marangoni drying. All of these drying techniques utilize some form of a moving liquid/gas interface on a substrate surface, which, if properly maintained, results in drying of a substrate surface without the formation of droplets. Unfortunately, if the moving liquid/gas interface breaks down, as often happens with all of the aforementioned drying methods, droplets form and evaporation occurs resulting in contaminants being left on the substrate surface.

In view of the foregoing, there is a need for improved cleaning systems and methods that provide efficient cleaning while reducing the likelihood of marks from dried fluid droplets.

SUMMARY

Broadly speaking, the present invention fills these needs by providing various techniques for reduction of entrance and/or exit marks caused by dried fluid droplets left by a substrate-processing meniscus.

It should be appreciated that the present invention can be implemented in numerous ways, including as a process, an apparatus, a system, a device, or a method. Several inventive embodiments of the present invention are described below.

In one embodiment, a carrier for supporting a substrate during processing by a meniscus formed by upper and lower proximity heads is provided. The carrier includes a frame having an opening sized for receiving a substrate and a plurality of support pins for supporting the substrate within the opening. The opening is slightly larger than the substrate such that a gap exists between the substrate and the opening. Means for reducing a size and frequency of entrance and/or exit marks on substrates is provided, the means aiding and encouraging liquid from the meniscus to evacuate the gap.

In another embodiment, a method for processing a substrate using a meniscus formed by upper and lower proximity heads is provided. A substrate is placed on a carrier having an opening sized for receiving the substrate and a plurality of support pins for supporting the substrate within the opening. The opening is slightly larger than the substrate such that a gap exists between the substrate and the opening. A size and frequency of at least one of entrance or exit marks on substrates is reduced by encouraging liquid from the meniscus to evacuate the gap.

Since introduction by the present Assignee of the use of a moving meniscus generated by a proximity head for use in cleaning, processing, and drying semiconductor wafers, it has become possible to wet and dry a substrate with a very low risk of droplets forming on the substrate surface. This technology has been very successful at preventing any droplets from being left on the active device region of the wafer after the meniscus is removed. However, the meniscus does occasionally tend to leave a small droplet on the exclusion zone of the substrate at the entrance and/or exit points as the substrate passes through the meniscus. The exclusion zone is at the edge of the substrate, extending from the active device region to the perimeter of the substrate, where microelectronic structures are not formed. On occasion, entrance and exit marks can become main surface marks, especially on hydrophilic wafers. Therefore, it is preferable that instances of such entrance and/or exit marks are reduced or eliminated.

A method is disclosed for processing a substrate. The method includes providing a substrate carrier having an opening sized for receiving a substrate and a plurality of support pins for supporting the substrate within the opening. A diameter of the opening is slightly larger than a diameter of the substrate such that a gap exists between a periphery of the substrate and the substrate carrier when the substrate is placed in the substrate carrier. The method also includes an operation for placing the substrate within the opening of the substrate carrier. The method further includes moving the substrate carrier with the substrate placed therein between upper and lower proximity heads, so as to subject a top surface of the substrate to a first meniscus formed by the upper proximity head, and so as to subject a bottom surface of the substrate to a second meniscus formed by the lower proximity head. The method also includes an operation for driving liquid of the first and second meniscuses from the gap between the periphery of the substrate and the substrate carrier as the first and second meniscuses traverse over the gap, so as to reduce a size and a frequency of at least one of entrance or exit marks on the substrate.

A method is also disclosed for forming a substrate carrier for use with a meniscus forming proximity head for substrate processing. The method includes forming a frame of the substrate carrier to have a top frame surface, a bottom frame surface, and a frame opening formed to extend from the top frame surface to the bottom frame surface. The frame opening has a diameter sized for receiving a substrate in an orientation in which top and bottom surfaces of the substrate are parallel to the top and bottom frame surfaces. The diameter of the frame opening is larger than a diameter of the substrate, such that an annular gap exists between a periphery of the substrate and the frame when the substrate is present in the frame opening. The method also includes providing a number of support pins on the frame to support the substrate within the frame opening. The method further includes forming a cutout in the frame proximate to the frame opening in at least one of a leading edge or a trailing edge of the frame proximate to the frame opening, such that the cutout is in fluid communication with the annular gap. The leading and trailing edges of the frame are referenced with regard to a linear direction of travel of the substrate carrier relative to the meniscus forming proximity head.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details. In other instances, known process operations and implementation details have not been described in detail in order to avoid unnecessarily obscuring the invention. The term, "meniscus," as used herein, refers to a volume of liquid bounded and contained in part by surface tension of the liquid. The meniscus is also controllable and can be moved over a surface in the contained shape. In specific embodiments, the meniscus is maintained by the delivery of fluids to a surface while also removing the fluids so that the meniscus remains controllable. Furthermore, the meniscus shape can be controlled by precision fluid delivery and removal systems that are in part interfaced with a controller computing system, which may be networked.

Figure 1:
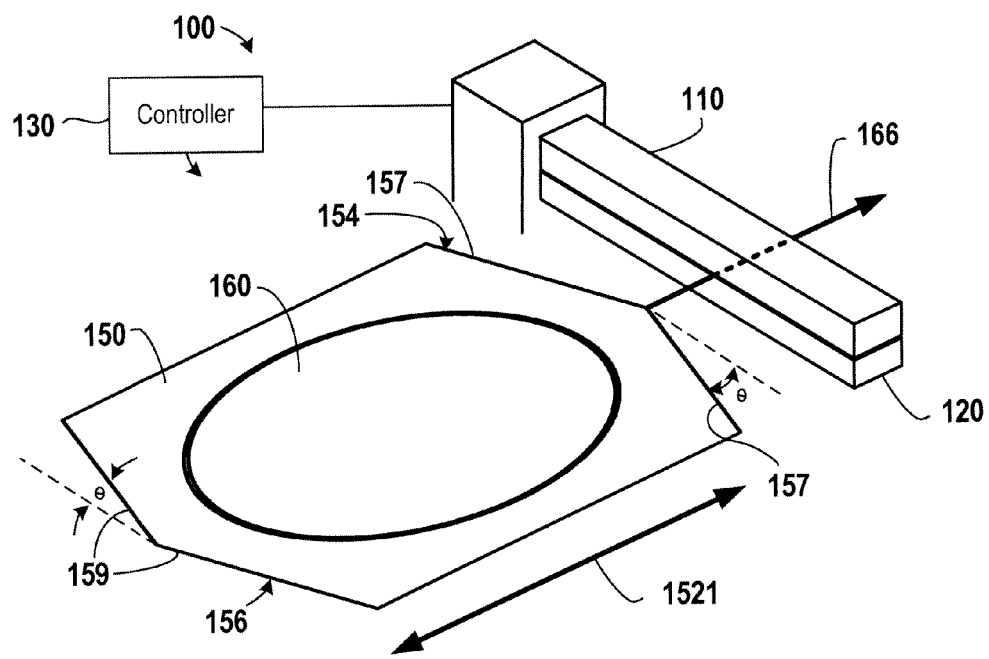
FIG. 1 is a perspective view of an exemplary implementation of a proximity head apparatus.

FIG. 1 is a perspective view of an exemplary implementation of a proximity head apparatus 100. In this example, substrate 160 is positioned within a carrier 150, which comprises a frame having a central opening sized for receiving substrate 160. Carrier 150 passes between upper proximity head 110 and lower proximity head 120 in the direction of arrow 166. Upper and lower proximity heads 110, 120, form a meniscus of fluid between them. Carrier 150 may be connected to some apparatus (not shown) for causing carrier 150 to move between upper and lower proximity heads 110, 120 in the direction of arrow 152l. In one embodiment, a substrate 160 is deposited on carrier 150 at a first location on one side of proximity heads 110, 120, and removed when carrier 150 arrives at a second location on an opposite side of proximity heads 110, 120. Carrier 150 may then pass back through proximity heads 110, 120, or over, under, or around proximity heads 110, 120, back to the first location, where a next substrate is deposited, and the process is repeated.

Carrier 150 includes a plurality of support pins 152 (shown in FIG. 7A), each having substrate support and centering features (not shown), to ensure a uniform carrier-substrate gap 158 between substrate 160 and carrier 150. In one embodiment, carrier 150 has sloped edges at the leading side 154 and trailing side 156 to prevent abrupt changes in the volume of meniscus liquid as carrier 150 enters and exits the meniscus. For example, carrier 150 has six sides with two leading edges 157 each angled from the transverse direction by an angle θ, e.g., 15°, and together forming a centrally-located point, and corresponding trailing edges 159 each forming the angle θ and together forming a centrally-located point. Other shapes that don't result in a rapid displacement of meniscus liquid are also possible, such as a trapezoid or parallelogram, wherein leading and trailing edges are at an angle other than a right angle to the direction of travel of the carrier or are at an angle to (i.e., not parallel with) the leading and trailing edges of the meniscus.

It should be noted that, while in the example shown in FIG. 1, the substrate moves through proximity heads 110, 120 in the direction of arrow 166, it is also possible for the substrate to remain stationary while the proximity heads 110, 120, pass over and under the substrate, so long as the substrate moves with respect to the proximity heads. Furthermore, the orientation of the substrate as it passes between the proxheads is arbitrary. That is, the substrate is not required to be oriented horizontally, but can instead be vertically oriented or at any angle.

In certain embodiments, a controller 130, which may be a general purpose or specific purpose computer system whose functionality is determined by logic circuits, software, or both, controls the movement of carrier 150 and the flow of fluids to upper and lower proximity heads 110, 120.

Figure 2:
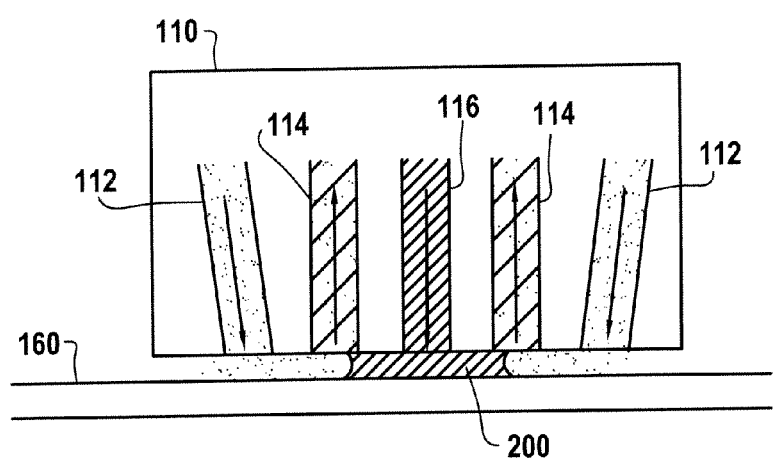
FIG. 2 shows a schematic representation of upper proximity head.

FIG. 2 shows a schematic representation of upper proximity head 110, which is a mirror image of lower proximity head 120 (FIG. 1). Each proximity head includes a plurality of central nozzles through which a liquid is supplied that forms meniscus 200. The liquid may be deionized water, a cleaning solution, or other liquid designed to process, clean, or rinse substrate 160. A plurality of vacuum ports 114 apply a vacuum at a perimeter of meniscus 200. Vacuum ports 114 aspirate liquid from meniscus 200 and surrounding fluid, such as air or other gas supplied by nozzles 112. In certain embodiments, nozzles 112 surround vacuum ports 114 and supply isopropyl alcohol vapor, nitrogen, a mixture thereof, or other gas or two-phase gas/liquid fluid. The nozzles 112 and fluid supplied therefrom aid in maintaining a coherent liquid/gas interface at the surface of meniscus 200. More details relating to proximity head structure and operation are incorporated by reference in the Cross-Reference to Related Applications section above. In particular, U.S. patent application Ser. Nos. 10/261,839, 10/330,843, and 10/330,897 are referenced for additional details relating to proximity head structure and operation.

FIGS. 3A through 3D illustrate a substrate 160 exiting meniscus 200 generated by upper and lower proximity heads 110, 120. In these Figures, substrate 160 and carrier 150 are moving to the left with respect to upper and lower proximity heads 110, 120. At the point shown in FIG. 3A, substrate 160 extends all the way through meniscus 200 such that leading edge 162 and trailing edge 164 of substrate 160 lie on opposite sides of meniscus 200 and leading edge 232 of meniscus 200 is approaching trailing edge 164 of substrate 160. It should be noted that, typically, substrate 160 will be circular and while carrier 150 is shown outside of meniscus 200, parts of carrier 150 may be in contact with meniscus 200, although not visible in this Figure.

Figure 3A:
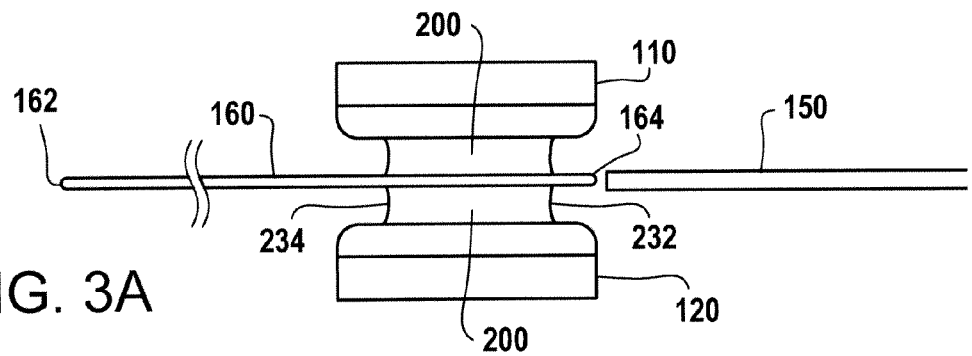
FIGS. 3A, 3B, 3C, and 3D illustrate a substrate exiting a meniscus generated by upper and lower proximity heads.
Figure 3B:
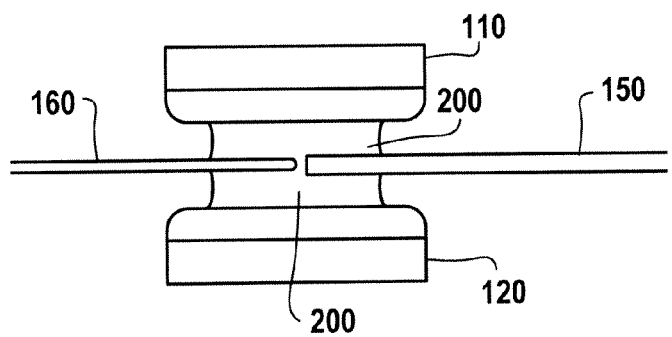

In FIG. 3B, meniscus 200 is transitioning from substrate 160 to carrier 150. At this point, trailing edge 164 is inside meniscus 200. In one embodiment, carrier 150 may be slightly thicker in cross section than substrate 160. For example, substrate 160 may be about 0.80 mm thick whereas the carrier may be about 1.5 mm thick. Thus, as meniscus 200 transitions onto carrier 150, a certain amount of meniscus liquid is displaced by carrier 150.

Figure 3C:
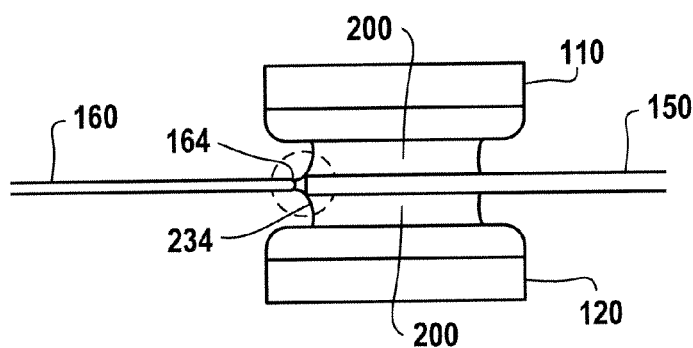

In FIG. 3C, meniscus 200 is transitioning completely off substrate 160 and onto carrier 150. At this time, the trailing edge 234 of meniscus 200 is still in contact with trailing edge 164 of substrate 160. Forces acting on meniscus 200 at this point in time is described with reference to FIG. 5 below.

Figure 3D:
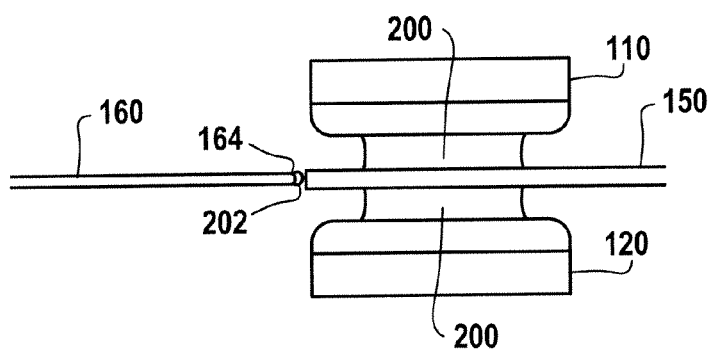

In FIG. 3D, the meniscus has completely transitioned off of substrate 160, leaving a small droplet 202 of meniscus liquid on the exclusion zone of substrate 160 at the trailing edge 164 of substrate 160. Droplet 202, if allowed to dry, can leave a spot formed of dissolved or entrained elements, the spot being referred to herein as an exit mark. If the substrate surface is hydrophilic, droplet 202 can migrate to the active device region of the substrate, which can cause defects in devices formed thereon. A number of factors are believed to contribute to the presence and size of small droplet 202 at the trailing edge 164 of substrate 160. It should be noted that an entrance mark at leading edge 162 can be formed in a similar manner as leading edge 162 exits meniscus 200.

Figure 4:
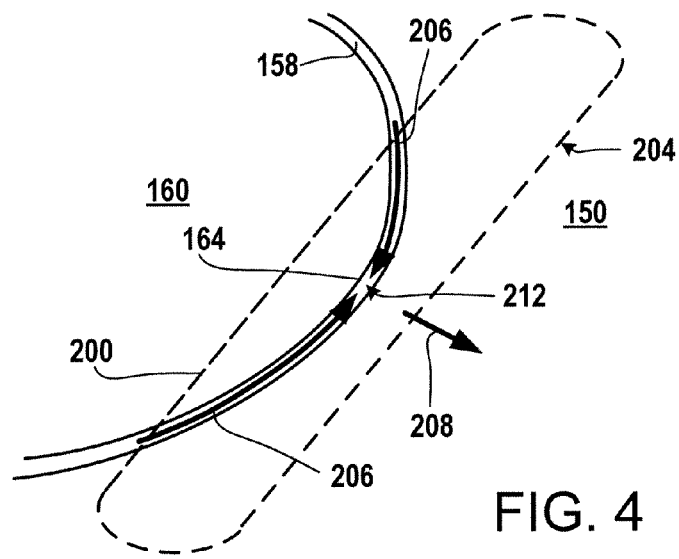
FIG. 4 shows a perspective view of a gap between a carrier and a substrate.

FIG. 4 shows a perspective view of a carrier-substrate gap 158 between a carrier 150 and a substrate 160. Meniscus perimeter 204 shows the area of contact of the meniscus with carrier 150 and substrate 160. The meniscus is traveling in the direction indicated by arrow 208. As the meniscus transitions off of substrate 160, meniscus fluid in carrier-substrate gap 158 is swept by the edge of the meniscus along the direction of arrows 206. As the trailing edge 210 of meniscus perimeter 204 reaches trailing edge 164 of substrate 160, fluid is directed toward a point 212 in carrier-substrate gap 158 adjacent to the substrate's trailing edge 164. It should be recognized that meniscus liquid is constantly flowing out of carrier-substrate gap 158 as the meniscus transitions onto carrier 150. Therefore, the liquid is not expected to literally follow arrows 206, but rather that a vector component of the direction of flow lies on arrows 206, resulting in a build-up of fluid at point 212.

Figure 5:
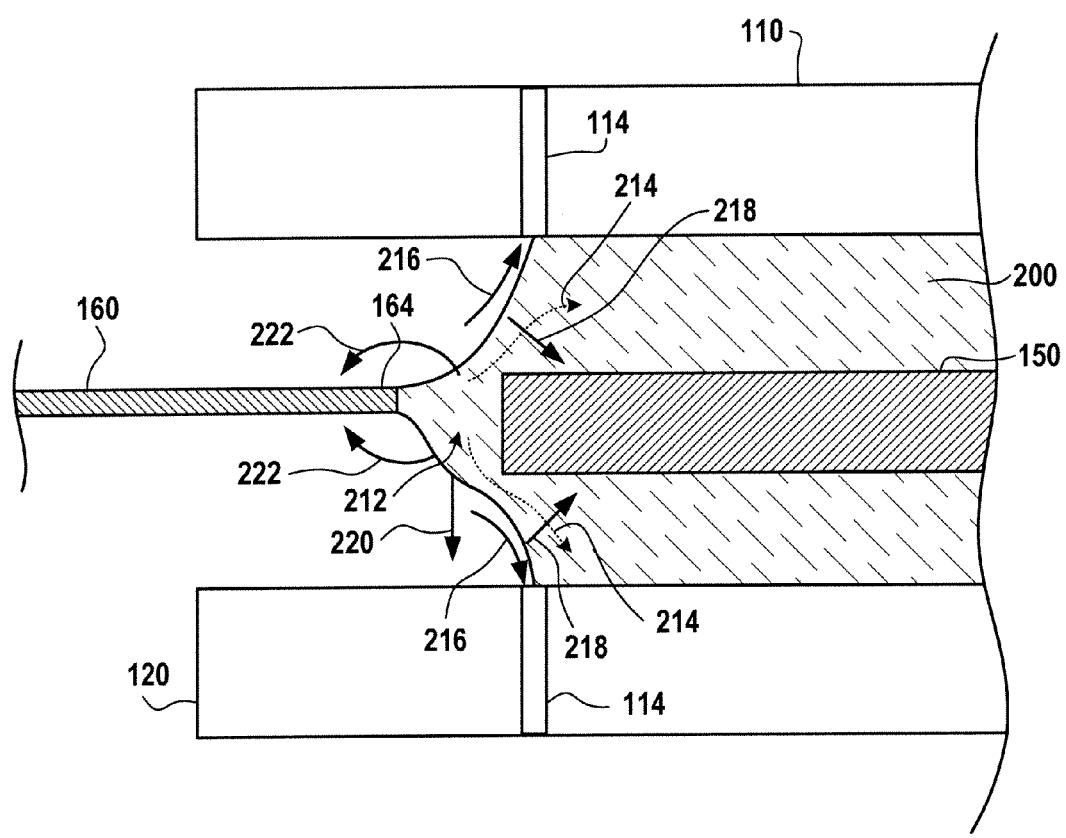
FIG. 5 shows a cross section view of a meniscus as it is completing transition onto carrier.

FIG. 5 shows a cross section view of meniscus 200 at point 212 as it is completing transition onto carrier 150. At this point, meniscus 200 is still attached to trailing edge 164 of substrate 160. Carrier 150 may be somewhat thicker than substrate 160, inhibiting the flow of liquid away from substrate 160 along arrows 214. Vacuum ports 114 draw fluid including meniscus liquid and surrounding gas, exerting a force on meniscus liquid indicated by arrows 216. An additional force is exerted by fluid exiting nozzles 112 (FIG. 2) which pushes inward against the gas/liquid interface of meniscus 200 as shown by arrows 218. A gravitational force 220 is also exerted against meniscus 200. And, if substrate 160 is hydrophilic, then an attraction to meniscus liquid can cause hydrogen bonding forces to pull water back onto substrate 160, as represented by arrows 222.

Figure 6A:
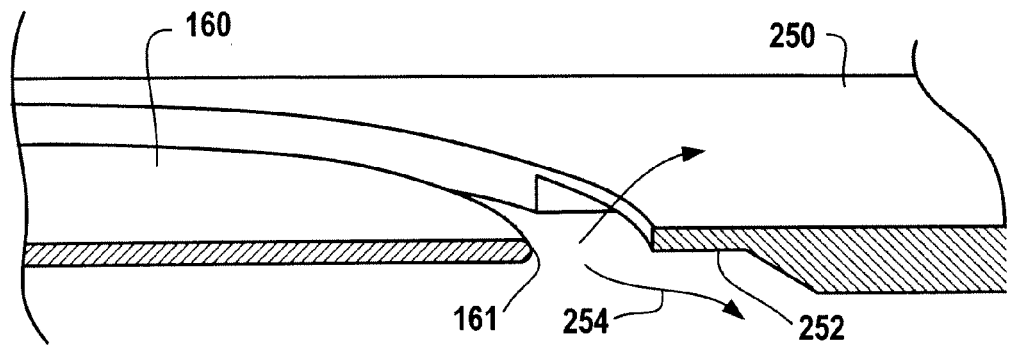
FIGS. 6A, 6B, and 6C show in perspective/cross-section views, exemplary embodiments of a carrier having means for reducing entrance and/or exit mark size and frequency, the means including a reduced thickness in a lip portion adjacent the leading and trailing edges of substrate.
Figure 6B:
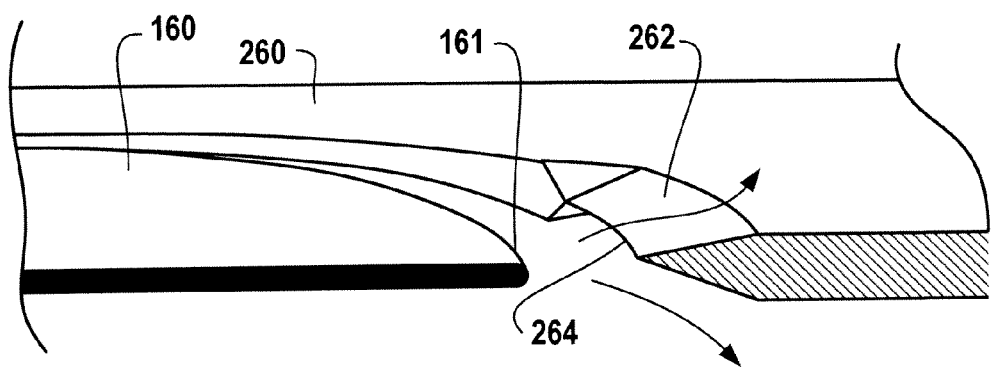
Figure 6C:
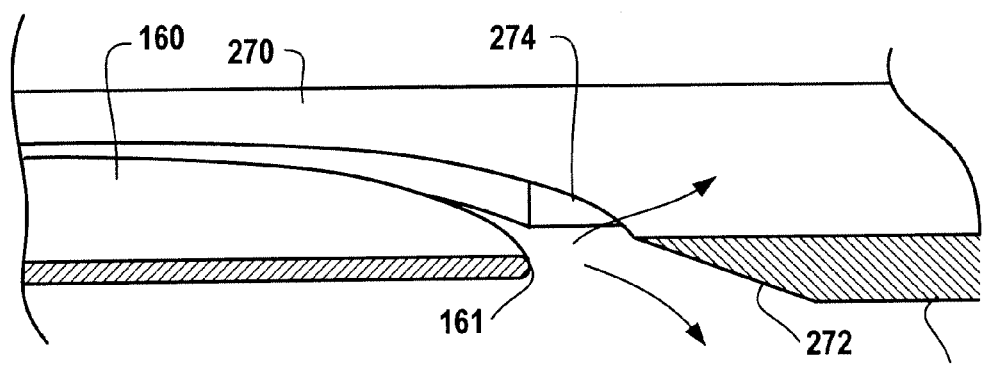
Figure 7A:
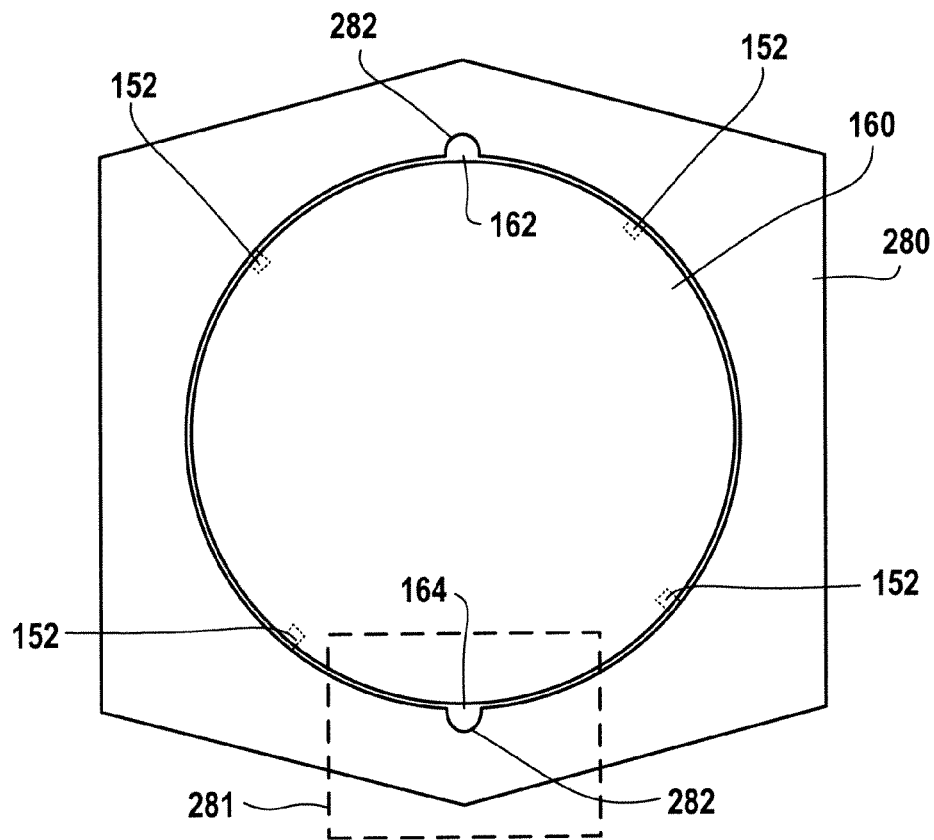
FIGS. 7A, 7B, 7C, and 7D show alternative embodiments of a carrier having means for reducing entrance and/or exit mark size and frequency, including cutouts near leading and trailing edges of the substrate.

FIGS. 6A, 6B, and 6C show in perspective/cross-section views, exemplary embodiments of a carrier having means for reducing entrance and/or exit mark size and frequency by enhancing the flow of meniscus liquid from the carrier-substrate gap as the meniscus transitions completely off of the substrate. In FIG. 6A, carrier 250 has a means for reducing entrance and/or exit mark size and frequency, which includes a reduced thickness in a lip portion 252 adjacent the leading and trailing edges of substrate 160. Specifically, the lower surface of carrier 250 tapers to a thinned lip portion 252 near point 161 of substrate 160, which can either be a leading edge 162 or trailing edge 164 (FIG. 7A). A thinned carrier at these locations can reduce both entrance mark and exit mark size and frequency by reducing the obstruction caused by carrier 250 as the meniscus transitions off of substrate 160. This allows fluid to more easily flow past the edge of carrier 250 and out of the gap formed between carrier 250 and substrate 160 as indicated by arrows 254. This can be compared to FIG. 5, in which carrier 150 can restrict the flow of meniscus liquid from the gap.

In FIG. 6B, carrier 260 has a means for reducing entrance and/or exit mark size and frequency, which includes a beveled portion 262 near point 161 in which upper and lower surfaces are beveled to form a knife edge 264 located on a plane between upper and lower surfaces of carrier 260. The knife edge 264 provides a thinned carrier portion, which can be formed near each of the leading and trailing edges of substrate 160. In FIG. 6C, carrier 270 has a means for reducing entrance and/or exit mark size and frequency, which includes a tapered portion 272 in which only one surface of carrier 270 is beveled to form a chisel edge 274 near point 161 of substrate 160. In one embodiment, the lower carrier surface 276 is beveled upward; in another embodiment, the upper carrier surface 278 is beveled downward.

It should be noted that the embodiments presented here are exemplary only, and a variety of variations are contemplated. For example, the entire internal perimeter of carrier 150 (FIG. 1) can be thinned by providing a lip, bevel, taper, etc., rather than just areas near point 161. The thinned carrier portion may enhance the flow of meniscus liquid from the carrier-substrate gap in areas other than at point 161.

Figure 7B:
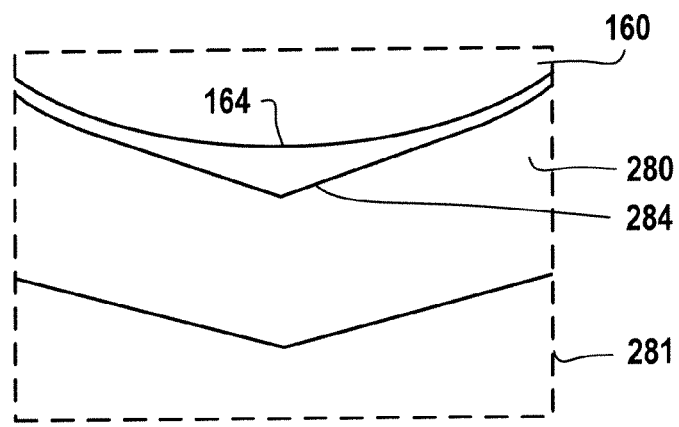
Figure 7C:
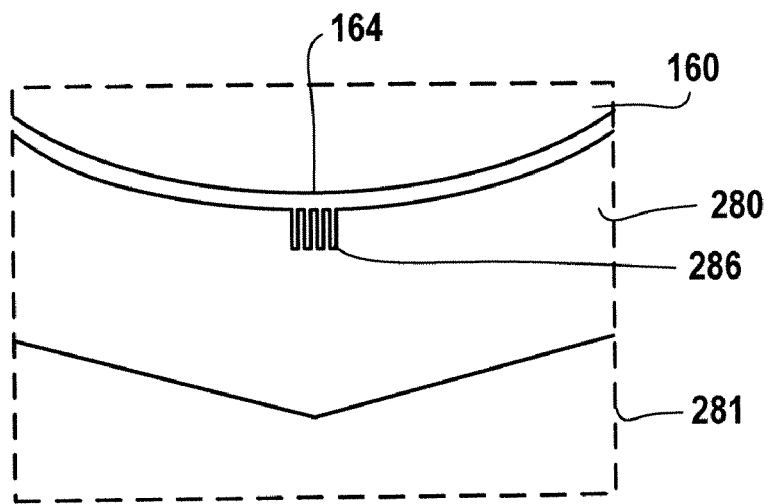
Figure 7D:
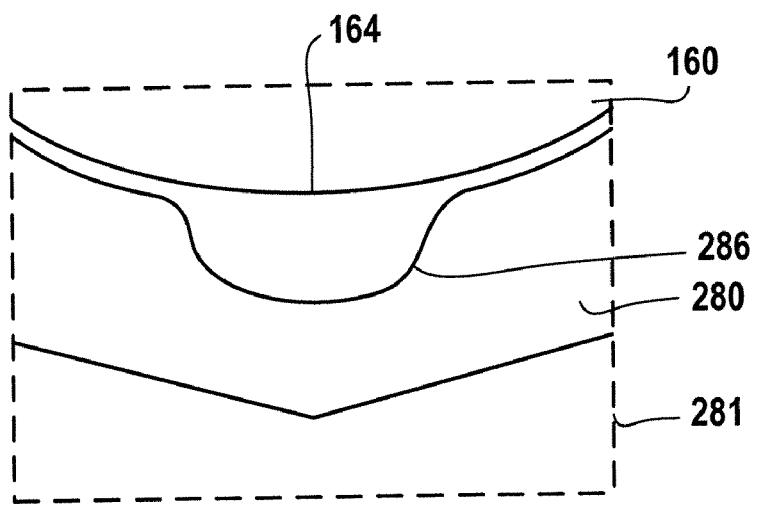

FIG. 7A shows a plan view of carrier 280 having a means for reducing entrance and/or exit mark size and frequency, which includes cutouts 282 near leading edge 162 and trailing edge 164 of substrate 160. Cutouts 282 remove any obstruction caused by the substrate carrier that might inhibit meniscus fluid from initially entering and finally exiting the carrier-substrate gap. Cutouts 282 may be molded or machined into carrier 280. In FIG. 7A, the cutouts 282 have a notch-shape. FIG. 7B shows portion 281 of FIG. 7A with an alternate embodiment of carrier 280 in which cutouts 284 are V-shaped. In FIG. 9C, portion 281 of FIG. 7A has another alternate embodiment of carrier 280, wherein the cutout comprises a plurality of slots or grooves 286 adjacent the leading and trailing edges (trailing edge shown) of substrate 160. Slots or grooves may be formed into or coated with hydrophilic material, which will tend to draw fluid out of the gap with capillary action as described below with reference to FIGS. 8A-8D. In FIG. 7D, a pocket-shaped cutout 286 is provided. It should be noted that the embodiments presented in FIGS. 7A-7D are exemplary only. Furthermore, a cutout may be provided on either or both of the leading edge or the trailing edge. Furthermore, a cutout of one size or shape may be provided on a leading edge and a cutout of a different size and/or shape may be provided on the trailing edge.

Generally, it is desired that the carrier be hydrophobic to the processing fluid because this aids in the global containment of the meniscus during processing. In addition, it is generally known that when a hydrophilic area is in contact with a hydrophobic area through a liquid film, fluid is preferentially drawn into the hydrophilic area due to surface tension effects. If the carrier is hydrophobic, then any meniscus liquid trapped in the substrate-carrier gap will be repulsed from the carrier and removal of the liquid from the gap will be inhibited. Furthermore, if the substrate is hydrophilic and the carrier is hydrophobic, then surface tension effects will encourage fluid to transfer out of the gap and onto the substrate, thus exacerbating entrance and exit mark formation. In certain embodiments, hydrophobic/hydrophilic characteristics of the carrier edge are engineered so as to use surface tension effects to assist the meniscus liquid in evacuating the carrier-substrate gap and flowing to the carrier, thereby reducing exit marks.

Figure 8A:
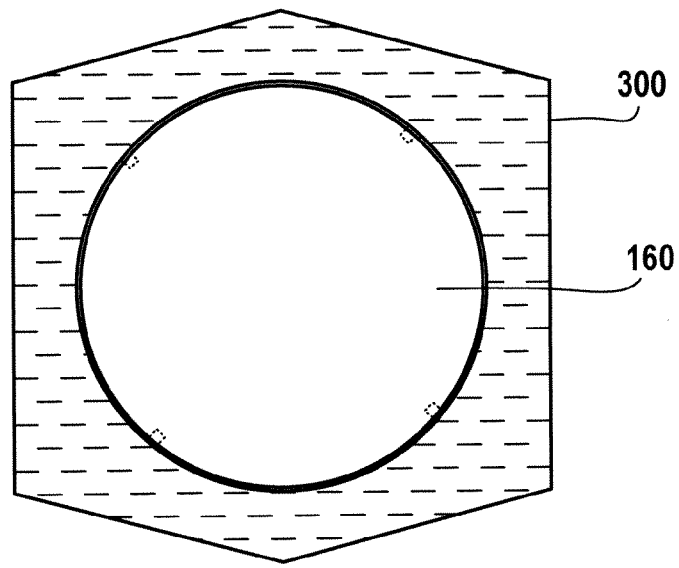
FIGS. 8A, 8B, 8C, and 8D show alternative embodiments of a carrier having a means for reducing entrance and/or exit mark size and frequency, which include a hydrophilic surface near the trailing edge of the substrate.

FIG. 8A shows a carrier 300 having a means for reducing entrance and/or exit mark size and frequency, which include a hydrophilic surface. A hydrophilic surface is one formed from a material that readily forms hydrogen bonds with a liquid such as water and is therefore more wettable than a hydrophobic surface. For example, a hydrophilic surface can be defined as one that has a contact angle of less than 40° and a hydrophobic surface can be defined as one that has a contact angle of greater than 60°. As is generally known, a contact angle may be measured by placing a small droplet of water on a flat horizontal surface and measuring an angle formed by the tangent of the liquid/gas interface at the point it touches the surface and the horizontal. Other methods are known for measuring hydrophobicity and hydrophilicity, and other thresholds may be used to determine whether a specific material is hydrophobic or hydrophilic.

Carrier 300 includes means for reducing the size and frequency of entrance and/or exit marks, the means including a surface that is globally hydrophilic, which is indicated in FIGS. 8A-8D by horizontal hash marks. In one embodiment, the upper and lower surfaces of carrier 300 are made globally hydrophilic by selecting an inherently hydrophilic material for carrier 300. Examples of such materials include $SiO_2$, $Al_2O_3$, and SiC. Other hydrophilic materials are of course known and can be used as well, such as treated polytetrafluoroethylene (PTFE) and like materials. In another embodiment, the surface of carrier 300 is made globally hydrophilic by applying a hydrophilic coating to a hydrophobic substrate. Such coatings can be formed from polymers and other materials and are generally readily commercially available. Carrier 300, being hydrophilic, will reduce any tendency of fluid to flow from the substrate-carrier gap back onto the wafer. To the extent that carrier 300 is more hydrophilic than substrate 160, the meniscus liquid will be drawn to carrier 300 as it transitions off of substrate 160.

Figure 8B:
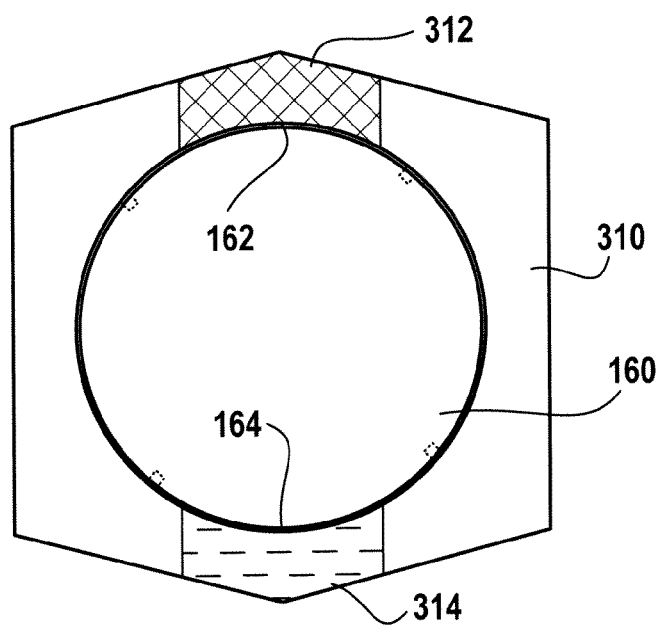

In FIG. 8B, a carrier 310 includes means for reducing the size and frequency of entrance and/or exit marks, which include hydrophobic region 312 adjacent leading edge 162 of substrate 160 and a hydrophilic region 314 adjacent trailing edge 164 of substrate 160. In one embodiment, substrate 160 is formed of hydrophobic material, but can be made more hydrophobic at hydrophobic region 312 by applying a silicone coating or a coating of another hydrophobic material such as Polyetheretherketones (PEEK), PolyVinylidine DiFluoride (PVDF) or Polytetrafluoroethylene (PTFE).

Figure 8C:
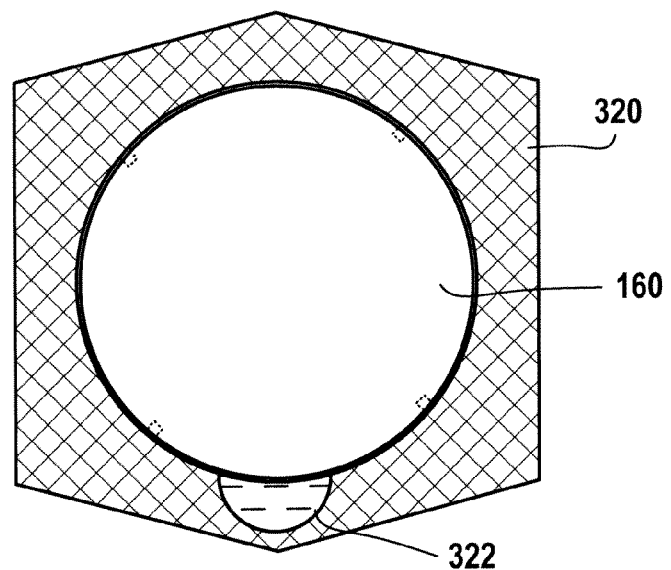
Figure 8D:
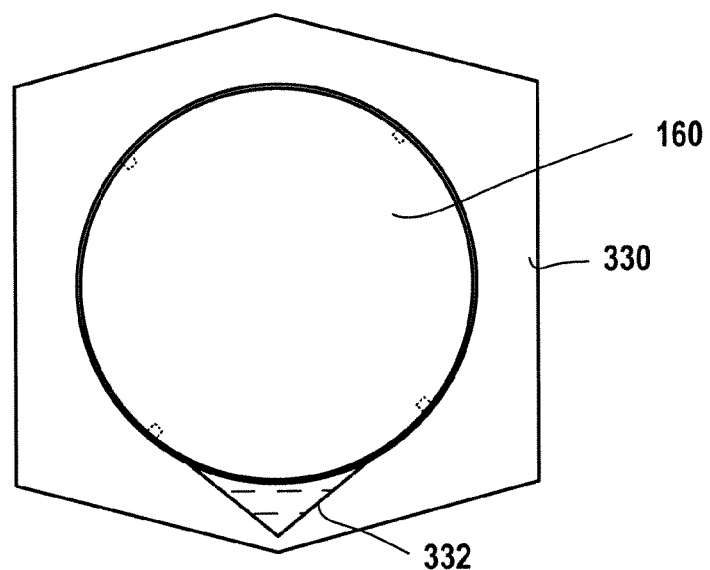

In FIG. 8C, a carrier 320 includes means for reducing the size and frequency of entrance and/or exit marks, the means including a globally hydrophobic carrier except for hydrophilic region 322 adjacent trailing edge 164 of substrate 160. Hydrophilic region 322 may be formed by a hydrophilic coating using a known material. In one embodiment, carrier 320 is formed from a hydrophobic material. In another embodiment, carrier 320 is formed from a material such as plastic that is hydrophobic and coated with a material that is even more hydrophobic such as silicone or silicone-containing polymer. A hydrophilic region 322 may be formed by applying a hydrophilic material. As with carrier 310 described above with reference to FIG. 8B, hydrophilic region 322 utilizes surface tension effects to draw meniscus liquid off substrate 160 and onto carrier 320. Similarly, in FIG. 8D, means for reducing the size and frequency of entrance and/or exit marks includes a V-shaped hydrophilic region 332 that causes meniscus liquid to draw off substrate 160 and onto carrier 330.

It should be recognized that variations on the shapes of hydrophobic and hydrophilic regions are envisioned to assist in reducing the size and frequency of entrance and/or exit marks. Furthermore, hydrophilic and hydrophobic regions may be used separately or in conjunction with notches described above with reference to FIGS. 7A through 7D, thinned or tapered profiles described above with reference to FIGS. 6A through 6C.

Figure 9A:
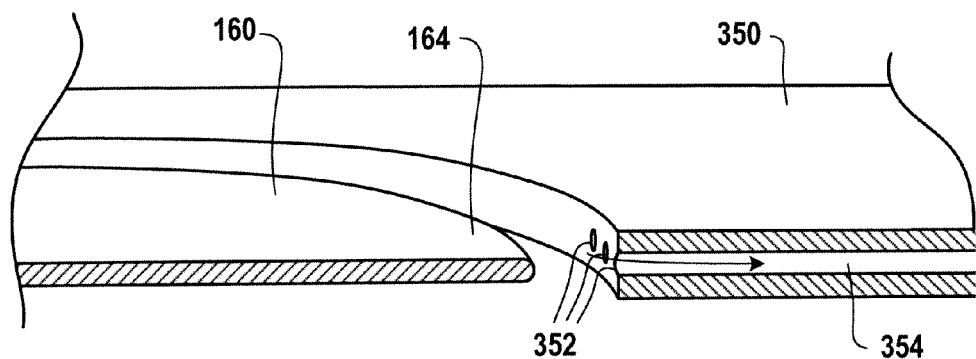
FIGS. 9A and 9B show a carrier having means for reducing the size and frequency of entrance and/or exit marks, the means including at least one vacuum port located adjacent one or both of the leading and trailing edge of the substrate.
Figure 9B:
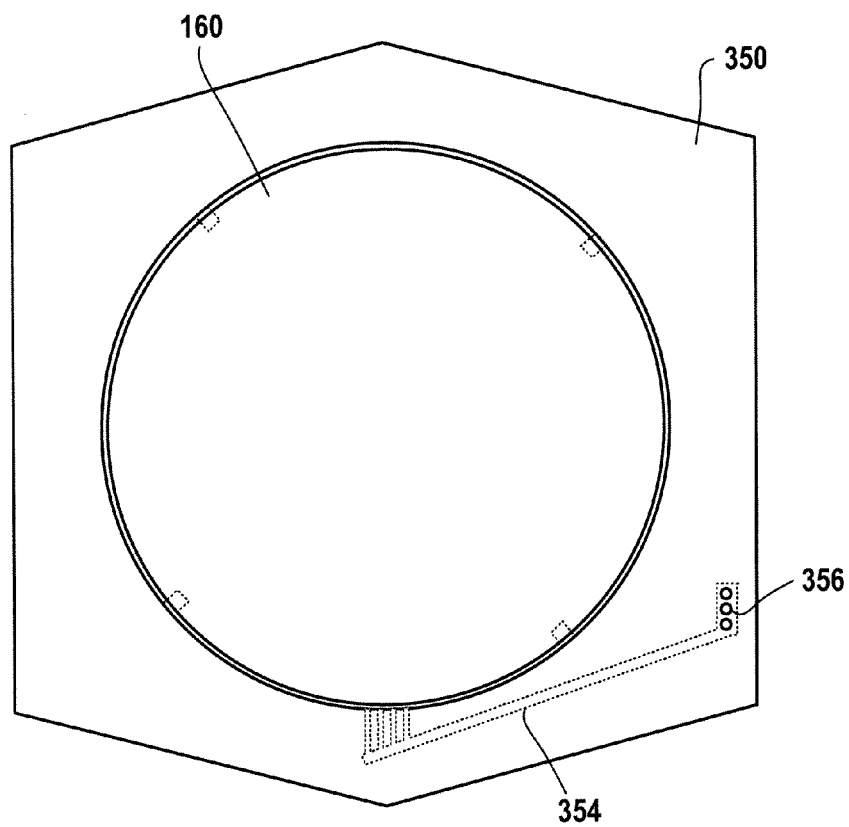

FIGS. 9A and 9B show a carrier 350 having means for reducing the size and frequency of entrance and/or exit marks, the means including at least one vacuum port 352 located adjacent leading 162 edge (not shown) or trailing edge 164 of substrate 160. Although only trailing edge 164 is shown in the drawings, a similar arrangement can be provided at a location on carrier near leading edge 162 of substrate 160. Each vacuum port 352 is in fluid communication with remote vacuum ports 356 by way of internal passageways 354. Internal passageways 354 may be formed by any appropriate means. For example, substrate 160 may be formed using a bottom layer with passageways 354 molded or engraved thereon, the bottom layer being then laminated to the top layer using friction welding, adhesive, or other means. Remote ports 356 may be molded or formed into the top layer.

In one embodiment, remote ports 356 are connected to a flexible hose (not shown), which is in turn connected to a vacuum source (not shown). As carrier 350 passes between the upper and lower proximity heads, the vacuum source is activated or a valve is opened just as the meniscus is transitioning completely off substrate 160. In another embodiment, remote ports 356 are arranged to align with a vacuum as the meniscus transitions off substrate 160. Thus, fluid in the substrate-carrier gap can therefore be drawn out through vacuum ports 352 and therefore prevented from adhering to substrate 160.

In another embodiment, compressed air, e.g., Compressed Dry Air (CDA) or other gas such as nitrogen, helium, Argon, etc., is supplied to internal passageway 354 and a venture (not shown) generates a vacuum which is supplied to ports 352. The combined compressed gas and aspirated fluid can then be routed or directed to an appropriate container or a harmless area of the chamber in which meniscus processing occurs.

Figure 10:
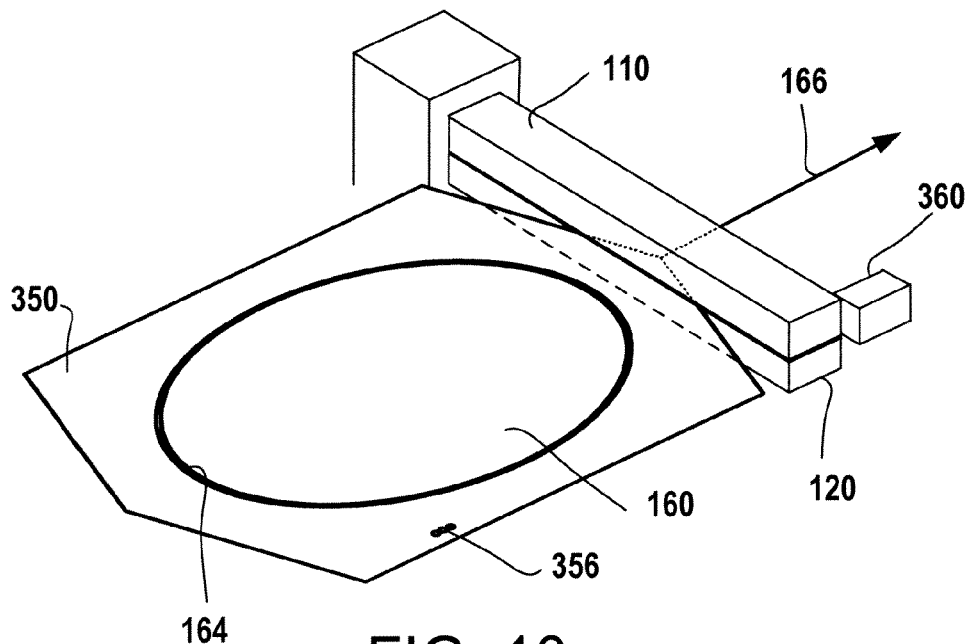
FIG. 10 shows a perspective view of an exemplary configuration for applying a suction to vacuum ports just as the meniscus transitions completely off the substrate and onto the carrier.

FIG. 10 shows a perspective view of an exemplary configuration for applying a suction to vacuum ports 352 just as the meniscus is transitioning completely off substrate 160 and onto carrier 350. In this exemplary embodiment, remote ports 356 align with vacuum source 360 when upper and lower proximity heads 110, 120, are aligned with trailing edge 164 of substrate 160 and the meniscus is transitioning completely off substrate 160 and onto carrier 350. At this time, vacuum source 360 will be in communication with vacuum ports 352 (FIG. 9A) and draw out meniscus liquid from the carrier-substrate gap.

Figure 11A:
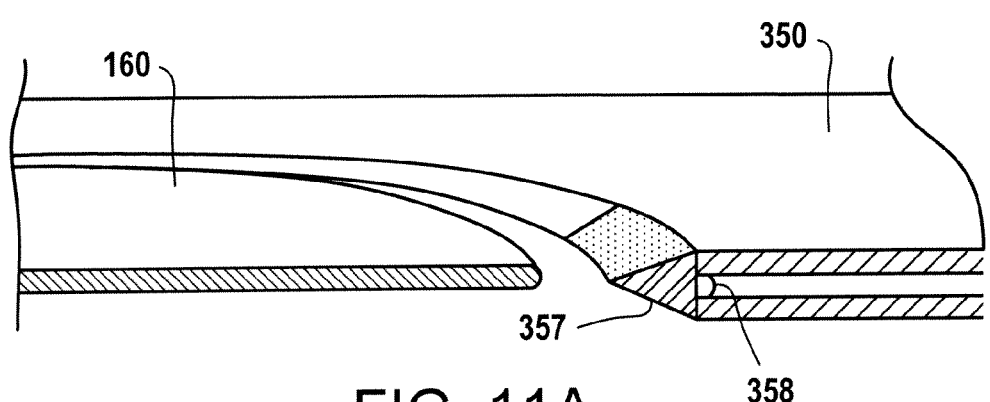
FIGS. 11A and 11B show a first alternative embodiment of the means for reducing the size and frequency of entrance and/or exit marks, the means including a porous edge.

FIG. 11A shows a first alternative embodiment of the means for reducing the size and frequency of entrance and/or exit marks, the means including a porous edge 357. Porous edge 357 may be made of sintered metal, or ceramic or polytetrafluoroethylene (PTFE)-based material having an open pore structure. A channel 358 can be provided to distribute the pressure drop evenly along the length of porous edge 357. Porous edge 357 is shown as having a beveled knife-edge shape, however other shapes can be provided such as having a semi-circular cross section, square cross section, or an asymmetrical cross section.

Figure 11B:
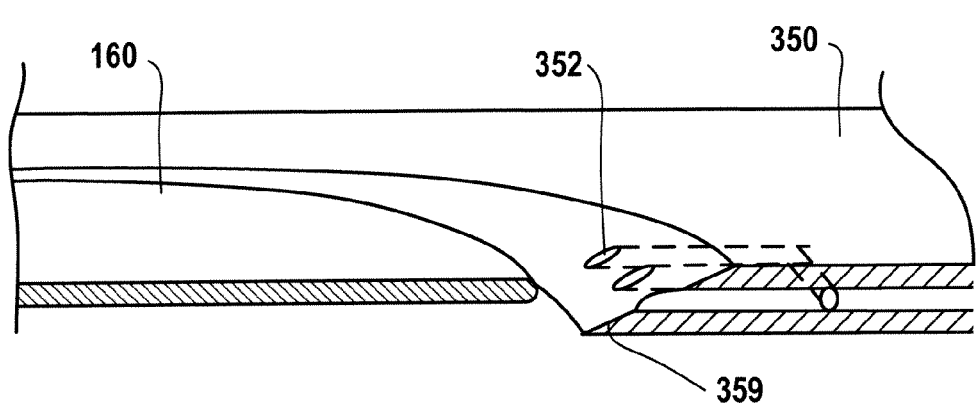

In FIG. 11B, a second alternative embodiment of the means for reducing the size and frequency of entrance and/or exit marks includes a tapered edge 359 having vacuum ports 352. Other edge shapes are possible, such as those described above with reference to FIGS. 6A-6C.

It should be noted that either or both the upper and lower proximity heads and the carrier can be controlled by a computer system such that the rate of travel of the carrier with respect to the proximity heads may be constant or vary depending on the position of the carrier with respect to the proximity heads. In some embodiments, for example, the rate of travel of the carrier may be slower as the meniscus transitions on and off the substrate, thereby providing additional time for meniscus liquid to flow out of the carrier-substrate gap. In addition, the vacuum from vacuum ports 352 in the carrier can also be computer controlled, either to time the activation/deactivation of suction, or to vary the flowrates depending on the relative position of the carrier with respect to the proximity heads. The computer control can be implemented using hardware logic or in conjunction with a multi-purpose computer processor, using a computer program written to control the movement and/or application of suction. In certain embodiments, a computer program also controls the volume and/or constituents of fluid supplied to the meniscus. Therefore, the computer program can define fluid recipes specifically tailored to each of a plurality of given applications.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as producing, identifying, determining, or comparing.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for processing a substrate, comprising:
   providing a substrate carrier having an opening sized for receiving a substrate and a plurality of support pins for supporting the substrate within the opening, wherein a diameter of the opening is slightly larger than a diameter of the substrate such that a gap exists between a periphery of the substrate and the substrate carrier when the substrate is placed in the substrate carrier;

placing the substrate within the opening of the substrate carrier;

moving the substrate carrier with the substrate placed therein between upper and lower proximity heads so as to subject a top surface of the substrate to a first meniscus formed by the upper proximity head and so as to subject a bottom surface of the substrate to a second meniscus formed by the lower proximity head; and driving liquid of the first and second meniscuses from the gap between the periphery of the substrate and the substrate carrier as the first and second meniscuses traverse over the gap so as to reduce a size and a frequency of at least one of entrance or exit marks on the substrate.

2. The method of claim 1, wherein liquid of the first and second meniscuses is driven from the gap as a leading edge of the substrate exits a trailing edge of the meniscus, thereby reducing the size and the frequency of entrance marks on the substrate.

3. The method of claim 1, wherein liquid of the first and second meniscuses is driven from the gap as a trailing edge of the substrate exits a trailing edge of the meniscus, thereby reducing the size and the frequency of exit marks on the substrate.

4. The method of claim 1, wherein the substrate carrier is provided with a thinned carrier portion proximate at least one of a leading edge or a trailing edge of the substrate.

5. The method of claim 1, wherein the substrate carrier is provided with a cutout proximate at least one of a leading edge or a trailing edge of the substrate.

6. The method of claim 1, wherein the substrate carrier is provided with a hydrophilic surface proximate to a trailing edge of the substrate as the substrate carrier is moved.

7. The method of claim 1, wherein the substrate carrier is provided with at least one vacuum port formed into the substrate carrier proximate to at least one of a leading edge or a trailing edge of the substrate, the method further comprising applying a suction to the at least one vacuum port.

8. The method of claim 7, wherein the suction is applied when the first and second meniscuses are transitioning off the substrate.

9. The method of claim 4, wherein the thinned carrier portion is formed within the substrate carrier in a continuous manner around the opening for receiving the substrate.

10. The method of claim 4, wherein the thinned carrier portion tapers to a knife edge proximate to a perimeter of the substrate when present within the opening of the substrate carrier.

11. The method of claim 4, wherein the thinned carrier portion tapers to a chisel edge proximate to a perimeter of the substrate when present within the opening of the substrate carrier.

12. The method of claim 5, wherein the cutout is notch-shaped.

13. The method of claim 5, wherein the cutout is V-shaped.

14. The method of claim 5, wherein the cutout includes a plurality of slots or grooves.

15. The method of claim 5, wherein the cutout is pocket-shaped.

16. The method of claim 6, wherein a material of the substrate carrier is a hydrophilic material.

17. The method of claim 6, wherein the substrate carrier includes a coating of a hydrophilic material.

18. The method of claim 6, wherein an entirety of a top surface of the substrate carrier and an entirety of a bottom surface of the substrate carrier are hydrophilic.

19. The method of claim 6, wherein the substrate carrier is hydrophobic except for the hydrophilic surface proximate to the trailing edge of the substrate.

20. The method of claim 6, wherein the substrate carrier is hydrophobic proximate a leading edge of the substrate.

* * * * *